(12) United States Patent
Huang

(10) Patent No.: US 7,644,341 B2
(45) Date of Patent: Jan. 5, 2010

(54) METHOD AND SYSTEM FOR CORRECTING SOFT ERRORS IN MEMORY CIRCUIT

(75) Inventor: Chien-Hua Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 561 days.

(21) Appl. No.: 11/026,354

(22) Filed: Dec. 30, 2004

(65) Prior Publication Data

US 2006/0150062 A1 Jul. 6, 2006

(51) Int. Cl.
*G11C 29/00* (2006.01)

(52) U.S. Cl. .................. 714/763; 714/42; 711/106; 711/167

(58) Field of Classification Search .......... 714/763, 714/42; 711/104, 106, 167; 365/222
See application file for complete search history.

(56) References Cited

U.S. PATENT DOCUMENTS

| | | | | |
|---|---|---|---|---|
| 5,003,542 A | * | 3/1991 | Mashiko et al. ............ 714/772 |
| 5,638,385 A | * | 6/1997 | Fifield et al. ............... 714/763 |
| 6,463,001 B1 | * | 10/2002 | Williams ..................... 365/222 |
| 6,649,456 B1 | | 11/2003 | Liaw .......................... 438/153 |
| 6,838,331 B2 | * | 1/2005 | Klein ......................... 438/238 |
| 6,965,536 B2 | * | 11/2005 | Shirley ....................... 365/222 |
| 2002/0018389 A1 | * | 2/2002 | Ito et al. ..................... 365/222 |
| 2002/0066052 A1 | * | 5/2002 | Olarig et al. ................. 714/42 |
| 2002/0162069 A1 | * | 10/2002 | Laurent ...................... 714/763 |
| 2003/0093744 A1 | * | 5/2003 | Leung et al. ................ 714/763 |
| 2004/0237023 A1 | * | 11/2004 | Takahashi et al. ........... 714/768 |
| 2004/0243886 A1 | * | 12/2004 | Klein .......................... 714/42 |
| 2005/0174833 A1 | * | 8/2005 | Hirabayashi ................ 365/154 |
| 2005/0283566 A1 | * | 12/2005 | Callaghan ................... 711/104 |
| 2005/0286331 A1 | * | 12/2005 | Ito et al. ..................... 365/222 |
| 2006/0028853 A1 | * | 2/2006 | Osada et al. .................. 365/63 |

* cited by examiner

*Primary Examiner*—Guy J Lamarre
*Assistant Examiner*—Sam Rizk
(74) *Attorney, Agent, or Firm*—Duane Morris LLP

(57) ABSTRACT

A method and a system for correcting a soft error in a memory circuit operates during a stand-by mode. After reading data from at least one memory cell without outputting the read data through an input/output module of the memory circuit in the stand-by mode, it is determined whether the read data is a soft error. If so, a correct value is written to the memory cell if the read data is the soft error.

17 Claims, 2 Drawing Sheets

US 7,644,341 B2

METHOD AND SYSTEM FOR CORRECTING SOFT ERRORS IN MEMORY CIRCUIT

BACKGROUND

The present invention relates generally to memory designs, and more particularly to a method to eliminate soft error rate by error checking and correcting (ECC) mechanisms.

The accumulation of soft errors is a quality limiting factor in semiconductor memories, such as static random access memories (SRAMs). Soft errors are those that occur unpredictably due to external causes. The most typical causes are alpha-particles from environmental sources and cosmic rays from universal sources. As these charged particles penetrate a semiconductor device, pairs of oppositely charged current carriers are generated. These carriers are immediately conducted as photocurrent and their charges are accumulated as spurious data. The march of technology means that components, such as transistors and capacitors, in integrated circuits, and memories are produced in greater numbers and ever smaller sizes. Therefore, the amount of charge that is required to register data has become very small, and the charge induced by the external causes has become more significant than ever. It is now easier to accumulate enough random charges to register spurious data, or soft errors. For example, the accumulation rate of soft error is an increasing problem in advanced semiconductor memories.

Various structures and processes have been proposed to alleviate this problem. One structural solution that has been realized is the addition of capacitors to each storage node of an SRAM. This means that more charge is required to shift the voltage on a storage node and thereby switch the data state that is stored at the node. However, the larger capacitance means not only that more charge is required to intentionally write data to that memory storage node, but also longer memory write time, thereby slowing down the random access speed. In addition, the construction of additional capacitors requires extra expensive processing and memory cell area.

One pure logic solution that has been utilized is the correction of soft errors by an error checking and correcting (ECC) logic circuit during read access cycles. Every time when a memory circuit is accessed for reading data, the ECC logic circuit would check the read data for soft errors. If error data are detected, the corrected data would be written back into the memory circuit. This requires not only 10 to 50 percent extra memory cell area, but also a reduction in access speed because the ECC logic circuit would impose a penalty on the read access cycles. Moreover, soft errors accumulate irregularly, but the ECC logic circuit can only correct them during a normal read access. Absent an operational demand for such access, errors can accumulate beyond the correction capacity of the ECC logic circuit, and those errors will not be corrected. Furthermore, the ECC logic circuit needs extra parity bits for error checking and correcting. For instance. every 8-bit data require extra 4 parity bits for single error correction, that means only one error is allowed to occur with this 12-bit memory cell area. The 4 parity bits would take 50% of the total area for the 8-bit data. This is a cell area penalty.

As technology advances, the occurrence of soft errors increases. Desirable in the art of memory designs are improved methods and systems that will increase soft error immunity without imposing a memory speed penalty, and an error correction capacity penalty due to an undesired accumulation of soft errors.

SUMMARY

This invention discloses a method and system for correcting a soft error for at least one memory cell in a memory circuit. According to the disclosure, after reading data from at least one memory cell without outputting the read data in a stand-by mode, it is determined whether the read data is a soft error. If so, a correct value is written to the memory cell if the read data is the soft error.

The construction and method of operation of the invention, however, together with additional objects and advantages thereof will be best understood from the following description of specific embodiments when read in connection with the accompanying drawings.

DESCRIPTION

The present invention provides a method and system that increases soft error immunity of a memory circuit such as SRAM and DRAM without imposing a memory speed penalty, and an error correction capacity penalty due to an undesired accumulation of soft errors.

Figure 1:
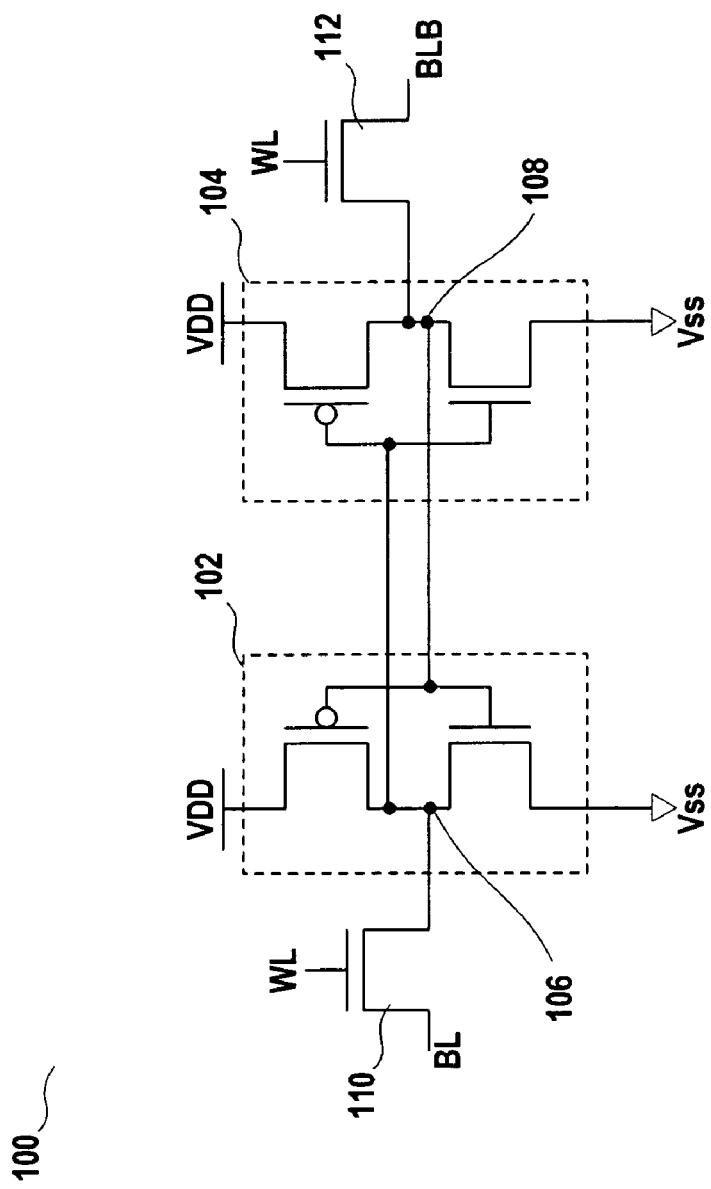
FIG. 1 is a schematic drawing of a conventional SRAM cell.

FIG. 1 presents a schematic drawing 100 illustrating a conventional SRAM cell, to which a soft error may happen due to external causes, such as cosmic radiation. The SRAM cell is constructed of two cross-coupled inverters 102 and 104. The central storage node 106 of the inverter 102 is directly connected to the gates of both, transistors of the inverter 104. The central storage node 108 of the inverter 104 is directly connected to the gates of both transistors of the inverter 102. The central storage node 106 of the inverter 102 is written to and read from through a transfer transistor 110 that is coupled to bit line BL. The central storage node 108 of the inverter 104 is written to and read from through a transfer transistor 112 that is coupled to bit line bar BLB. The transfer transistors 110 and 112 are controlled by a common word line WL. A storage node is a capacitor that is composed of the near junction capacitances of the three transistors that are connected thereto. An alpha particle or a cosmic ray penetrating the IC at anywhere near those junctions will generate pairs of oppositely charged current carriers. Due to the carriers induced by high-energy alpha particles or neutrons, the amount may be much large than storage charge. It will shift the voltage to switch the data state of the storage node, then spurious data is stored and a soft error has occurred. The smaller the total capacitance of a storage node, the smaller the electrical charge it holds to represent data and the lower the immunity it has to the influence of charges arriving from external sources. Advanced technology produces smaller transistors with smaller junction capacitances. So, a memory cell that is constituted by those smaller transistors are more susceptible to occurrence of soft errors caused by, for example, cosmic radiation. It is noted that while an SRAM cell is used as an example for explaining the soft error problems, other types of memories, such as DRAM, may also suffer from the same problem.

To address the soft error problem, careful use can be made of memory cycle time. Peripheral circuits may be added to a memory circuit to achieve this with no change in its semiconductor structure or logical organization.

Figure 2:
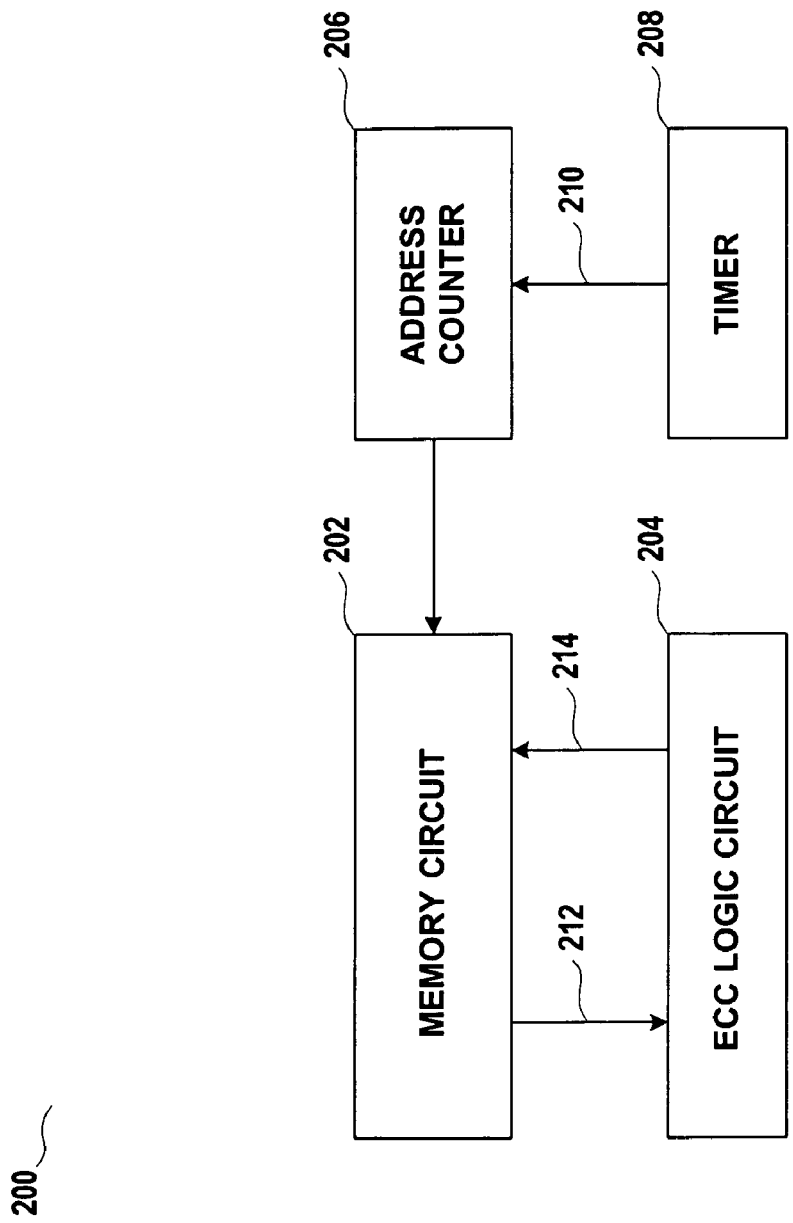
FIG. 2 is a logic diagram of a memory circuit with an ECC logic circuit, an address counter, and a timer, in accordance with one embodiment of the present invention.

FIG. 2 is a logic diagram of an integrated circuit (IC) 200 that includes a memory circuit 202 with an ECC logic circuit 204, an address counter 206, and a timer 208, in accordance with one embodiment of the present invention. In this embodiment, an improved method is proposed whereby the ECC logic circuit 204 operates only when the memory circuit 202 is in a stand-by mode, and whereby no change is required in the structure or operation of the memory circuit 202. In essence, while in a stand-by mode, with the assistance of the timer 208 and the address counter 206, the ECC logic circuit 204 "scans" data in a word-by-word fashion in the memory circuit in search for errors. If an error is detected in one or the word values read, a correction is made immediately.

More particularly, according to one embodiment of the present invention, the timer 208 generates an initiation signal 210 that triggers a dummy read cycle while the memory circuit is in a stand-by mode. A dummy read cycle is similar to a standard read operation for accessing the data stored in the memory circuit except that the data read is not going through an input/output circuit for providing the same to external connections. The dummy read cycle accesses one or more bits (e.g., a word) of the data stored in a sequential manner. For instance, it will typically check for errors on at least one word of data. The interval period between two initiation signals may be subject to adjustments as the memory circuit can be fully "examined" if time permits or can be partially examined if the memory circuit is pulled out from the stand-by mode. In any circumstance, the dummy read cycle or the correction actions intended to be taken will stop and yield to a normal read or write operation. That is, the ECC logic circuit 204 will be deactivated or suspended until the normal read or write operation is over. In some situations, the suspended operation can be resumed, while in some other situations, the error checking process is restarted by another dummy read cycle. Therefore, it will only take place when the memory circuit is in a stand-by mode. As how long the period should be set, the determination can be made based on historical occurrence frequency of soft errors. In other words, if the soft error occurs very frequently, then the dummy read and correction action need to be implemented very frequently as well.

The address counter 206 sequentially counts addresses of the memory cells, each storing one word of data, in the memory circuit 202. The counting proceeds from one word of the memory cell to the next, when the word is read of no soft error, or it has been written with the correct value.

The ECC logic circuit 204, through a command path 212, will check the memory address advanced by the address counter 206 for parity errors. If the ECC logic circuit 204 detects an error, it generates a flag signal 214, which will trigger a write access operation. A correct value will be written into that memory address through the write access. If no error is detected in the dummy read, the address counter will count to the next memory cell address.

With the timer 208 periodically generating initiation signals to trigger dummy read cycles, this system is constantly searching the memory addresses, in sequence, for errors in data, and correcting them, during the stand-by mode. As such, the active ECC logic circuit 204 keeps up with the changing state of the memory and, therefore, prevents an undesirable accumulation of soft errors. In this fashion, a soft error immunity mechanism is implemented. Since it is inevitable to completely prevent soft errors from occurring, this mechanism prevents them from accumulating for a long period of time, thereby preventing the soft errors from impacting the performance of the memory circuit.

The present invention adds a pure logic process for the memory circuit to improve its performance while without changes in the structure of the memory IC. The ECC logic circuit 204 waits its turn, so to speak, and functions only during stand-by modes of the memory. Therefore, the ECC logic circuit 204 never gets in the way and it does not slow down the normal access time for writing or reading data into or from a cell. So, there is no penalty on access cycle time by adding the additional hardware of ECC, the timer, and the address counter. In fact, if the memory device has the timer and address counter, these two modules do not need to be separately added.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for correcting a soft error in a memory circuit during a stand-by mode, the method comprising the following steps performed during the stand-by mode:
    performing an error correction routine comprising the steps of:
        reading data from all memory cells in the memory circuit in a sequential manner without outputting the read data through an input/output module of the memory circuit;
        determining whether the read data for each memory cell is a soft error; and
        for each memory cells for which the read data is the soft error, writing a predetermined value to the memory cell,
    wherein the reading or writing step of the error correction routine is stopped without completion thereof if the memory circuit is switched to normal operation mode out of stand-by mode for avoiding interfering with normal reading or writing operations.

2. The method of claim 1 wherein the reading is initiated on a periodical basis.

3. The method of claim 2 wherein a frequency for initiating the reading is adjustable depending on a frequency of soft error occurrence.

4. The method of claim 1 wherein the writing further comprises generating a flag signal to trigger a write access for writing the memory cell to correct the soft error.

5. The method of claim 1, further comprising the step of resuming said error correction routine from a point where it stopped after said normal operation mode upon returning to said stand-by mode.

6. The method of claim 1, further comprising the step of starting said error correction routine after said normal operation mode upon return to said stand-by mode.

7. The method of claim 1, wherein said memory cells are SRAM cells.

8. A method for correcting soft errors in a memory circuit, the method comprising:

generating an initiation signal for an error correction routine on a periodic basis when the memory circuit is in a stand-by mode;

during said stand-by mode reading one or more word values of a set of memory cells in response to the initiation signal without outputting the word values though an input/output module of the memory circuit; and during said stand-by mode writing a correct value to the memory cell if any one of the word values is a soft error, wherein a frequency for generating the initiation signal is adjustable depending on a frequency of soft error occurrence, and wherein the error correction routine is deactivated or suspended without completion thereof if the memory circuit is switched to normal operation mode out of stand-by mode for avoiding interfering with normal reading or writing operations.

9. The method of claim 8 further comprising using an address counter for generating addresses of the memory cells for reading the word values thereof.

10. The method of claim 9 wherein the address counter generates the addresses sequentially.

11. The method of claim 8 wherein the writing further comprises generating a flag signal to trigger a write operation for writing the memory cell with the correct value if the word value is a soft error.

12. The method of claim 8 wherein the set of memory cells includes all memory cells in the memory circuit.

13. The method of claim 8, wherein said memory cells are SRAM cells.

14. A system for correcting soft errors of a memory circuit, the system comprising:

a timer for initiating a dummy read cycle of an error correction routine when the memory circuit is in a stand-by mode, wherein the timer generates a signal for initiating the dummy read cycle periodically and wherein a frequency for the timer to initiate the dummy read cycle is adjustable depending on a frequency of soft error occurrence;

an address counter for producing during said stand-by mode one or more addresses corresponding to one or more memory cells in the memory circuit after the dummy read cycle is initiated; and an error checking and correcting circuit for reading one or more word values of one or more memory cells during said stand-by mode based on the addresses generated by the address counter and for writing a correct value to the memory cell during said stand-by mode if any of the word values is a soft error, wherein the error checking and correcting circuit is deactivated or suspended when a normal read or write operation is initiated such that the reading or writing is stopped without completion thereof for avoiding interfering with normal read or write operations.

15. The system of claim 14 wherein the address counter counts the addresses of the memory cells sequentially until all the memory cells in the memory circuit are examined.

16. The system of claim 14 wherein the error checking and correcting circuit generates a flag signal to trigger a write operation for writing the memory cell with the correct value if the word value is incorrect.

17. The system of claim 14, wherein said memory cells are SRAM cells.

* * * * *

UNITED STATES PATENT AND TRADEMARK OFFICE
CERTIFICATE OF CORRECTION

PATENT NO. : 7,644,341 B2  Page 1 of 1
APPLICATION NO. : 11/026354
DATED : January 5, 2010
INVENTOR(S) : Chien-Hua Huang It is certified that error appears in the above-identified patent and that said Letters Patent is hereby corrected as shown below:

Column 2, line 41, after "of both" delete ",".

Column 5, Claim 8, line 10, replace "though" with "through".

Signed and Sealed this

Twenty-third Day of March, 2010

David J. Kappos
*Director of the United States Patent and Trademark Office*